(12) United States Patent
Garni et al.

(10) Patent No.: US 6,760,266 B2
(45) Date of Patent: Jul. 6, 2004

(54) SENSE AMPLIFIER AND METHOD FOR PERFORMING A READ OPERATION IN A MRAM

(75) Inventors: Bradley J. Garni, Austin, TX (US);
Mark F. Deherrera, Tempe, AZ (US);
Mark A. Durlam, Chandler, AZ (US);
Bradley N. Engel, Chandler, AZ (US);
Thomas W. Andre, Austin, TX (US);
Joseph J. Nahas, Austin, TX (US);
Chitra K. Subramanian, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 112 days.

(21) Appl. No.: 10/185,566

(22) Filed: Jun. 28, 2002

(65) Prior Publication Data

US 2004/0001383 A1 Jan. 1, 2004

(51) Int. Cl.[7] .................................................. G11C 7/02
(52) U.S. Cl. .................... 365/209; 365/209; 365/213
(58) Field of Search ................................ 365/209, 213, 365/158, 210, 205, 207, 208, 230.07

(56) References Cited

U.S. PATENT DOCUMENTS

| | | | |
|---|---|---|---|
| 4,763,026 A | * | 8/1988 | Tsen et al. ................. 327/56 |
| 5,309,393 A | * | 5/1994 | Sakata et al. .......... 365/189.01 |
| 6,188,615 B1 | | 2/2001 | Perner et al. |
| 6,191,989 B1 | | 2/2001 | Luk et al. |
| 6,205,073 B1 | | 3/2001 | Naji |
| 6,256,247 B1 | | 7/2001 | Perner |
| 6,379,978 B2 | | 4/2002 | Goebel et al. |
| 6,392,853 B1 | | 5/2002 | Li et al. |
| 6,392,924 B1 | | 5/2002 | Liu et al. |

OTHER PUBLICATIONS

Ranmuthu et al., "A 512K–Bit Magneto Resistive Memory with Switched Capacitor Self–Referencing Sensing," *IEEE Transactions on Circuits and Systems–II: Analog and Digital Signal Processing*, 1992, vol. 39, No. 8, pp. 585–587.
Ranmuthu et al., "A Sensing Scheme for Giant Magneto–Resistive Memories," *Magnetics Conference, Digest of International Pages, Intermag '93*, 1993.

* cited by examiner

*Primary Examiner*—David Nelms
*Assistant Examiner*—Thinh T Nguyen
(74) *Attorney, Agent, or Firm*—Daniel D. Hill; James L. Clingan, Jr.

(57) ABSTRACT

A sense amplifier (1300, 1500) is provided for sensing the state of a toggling type magnetoresistive random access memory (MRAM) cell without using a reference. The sense amplifier (1300, 1500) employs a sample-and-hold circuit (1336, 1508) combined with a current-to-voltage converter (1301, 1501), gain circuit (1303), and cross-coupled latch (1305, 1503) to sense the state of a bit. The sense amplifier (1300, 1500), first senses and holds a first state of the cell. The cell is toggled to a second state. Then, the sense amplifier (1300, 1500) compares the first state to the second state to determine the first state of a toggling type memory cell.

19 Claims, 10 Drawing Sheets

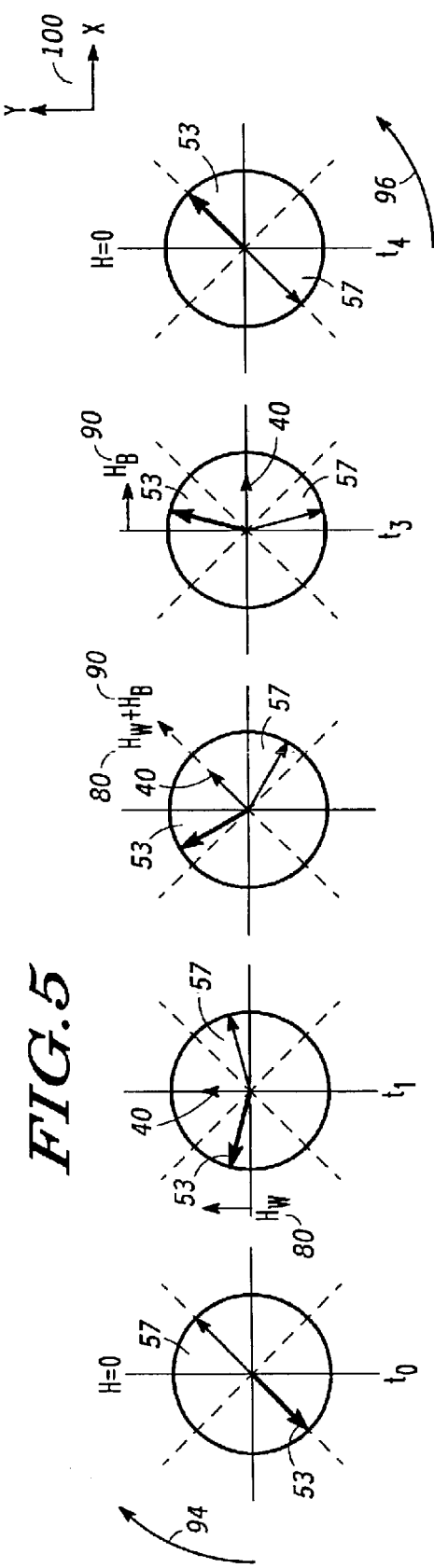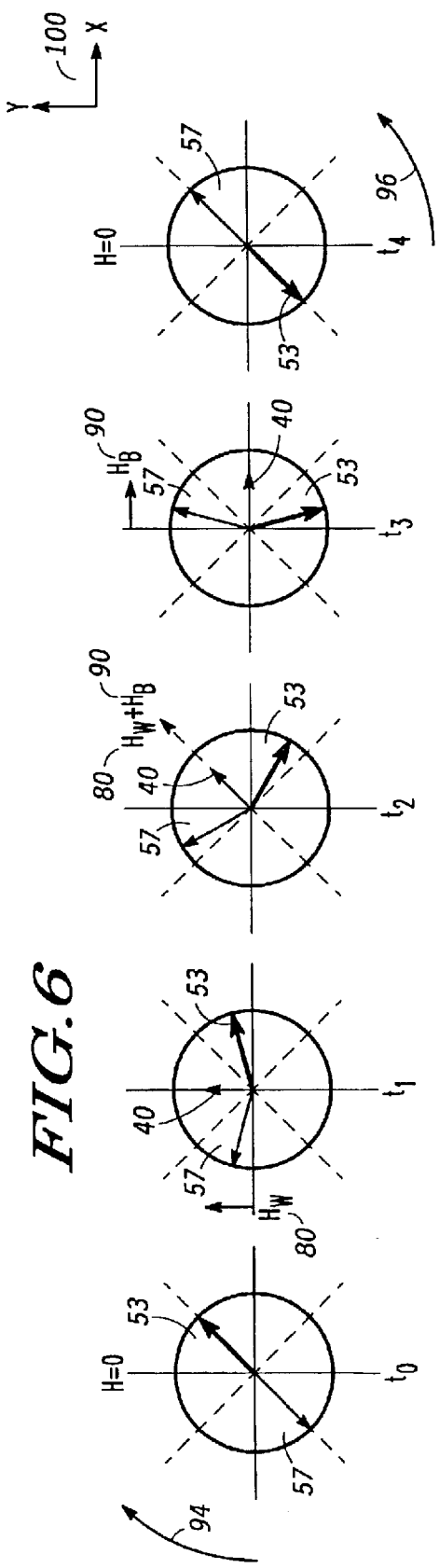

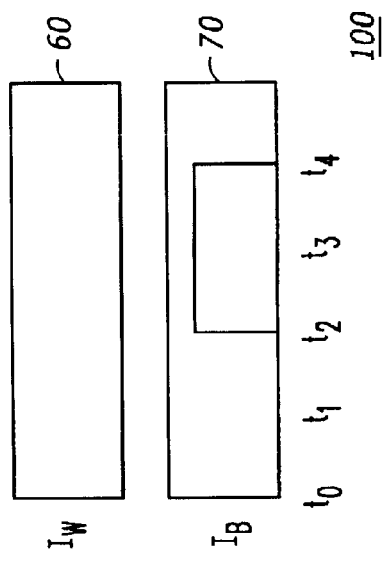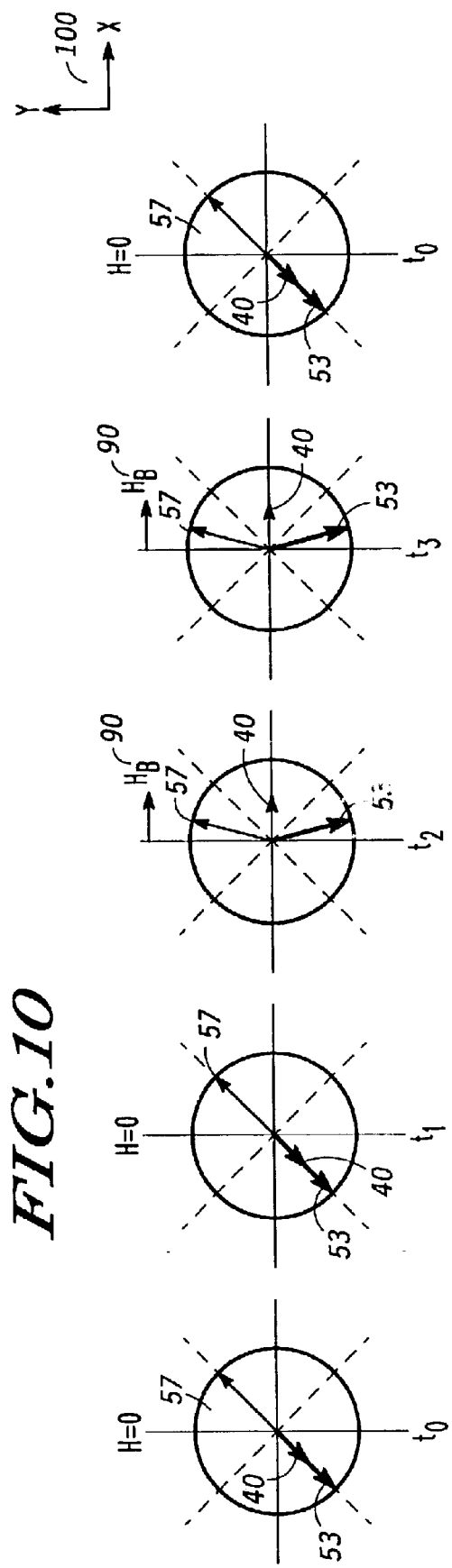
FIG. 9
FIG. 10

SENSE AMPLIFIER AND METHOD FOR PERFORMING A READ OPERATION IN A MRAM

RELATED APPLICATIONS

This application is related to:

U.S. patent application Ser. No. 09/978,859, entitled "A Method of Writing to a Scalable Magnetoresistance Random Access Memory Element," filed Oct. 16, 2001, and assigned to the assignee hereof; and U.S. patent application docket No. SC12159TC, entitled "Circuit and Method for Reading a Toggle Memory Cell", filed simultaneously herewith, and assigned to the assignee hereof.

FIELD OF THE INVENTION

This invention relates to Magnetoresistive Random Access Memories (MRAMs), and more particularly to a read operation for a MRAM having toggling memory cells.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Reading data stored in the memory is accomplished by sensing differences in tunnel junction resistance in the MRAM cells between the two states. Typically, the stored state of a memory cell can be determined by comparing the cell state to that of a reference cell. However, a problem occurs when the MRAM cell is a "toggling" cell. That is, a write operation for a toggling cell does not set the bit to a particular value or state, but rather toggles the value between the two states. Accordingly, the cell state must be determined first before the write operation takes place. However, the reference cell state must also be determined before it can be used. Therefore, there is a need for a way to determine the state of a MRAM cell without the use of a reference.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 4 is a graph illustrating the timing diagram of the word current and the bit current when both are turned on.

FIG. 5 is a diagram illustrating the rotation of the magnetic moment vectors for a magnetoresistive random access memory device for the toggle write mode when writing a '1' to a '0'.

FIG. 6 is a diagram illustrating the rotation of the magnetic moment vectors for a magnetoresistive random access memory device for the toggle write mode when writing a '0' to a '1'.

FIG. 9 is a graph illustrating the timing diagram of the word current and the bit current when only the bit current is turned on.

FIG. 10 is a graph illustrating the rotation of the magnetic moment vectors for a magnetoresistive random access memory device when only the bit current is turned on.

DETAILED DESCRIPTION OF THE PREFERRED EMBODIMENT

In MRAM cells, magnetic fields are applied to the magnetic free layer to rotate its polarization. Two perpendicular lines lying above and below the cell deliver high currents that create the magnetic fields for switching the bit. A specific sequence of current is used to change the state of the bit. This method does not directly write a high or low state, but toggles the present state to the opposite state. This switching/writing method may also perform a partial write to "wiggle" the bit or change the resistance temporarily. The appropriate sequence of signals may then abort the write operation, returning the cell to its original state.

Generally, the present invention provides a sense amplifier and method for sensing a MRAM cell that does not require the use of a reference cell to determine the state of the cell during a read operation. In one embodiment, the state of the cell is determined by comparing a present state of the cell being read to a state of the cell after toggling the cell to the opposite state. The present state is then compared to the state after toggling to determine the cell's logic state. For example, if the cell changes state during the toggling operation and the "after" value is greater than the "before" value, then the before state is a logic low and the after state is a logic high. In another embodiment, instead of toggling the cell to provide the "after" value, the toggling signals are applied to move the magnetic moment of the free layer a portion of the rotation required to toggle the cell, and then to return the magnetic moment to its initial state, thus "wiggling" the cell to determine in which direction the cell is changing: either to a lower resistance value or to a higher resistance value. It has been determined that write currents that are applied to the cell to rotate the magnetic moment 90 degrees or less, may change the cell resistance between 15 and 50 percent of the total resistance change with 180 degrees of rotation needed to "toggle" the cells. These program sequences do not change the direction of polarization and the free layer returns to its previous polarization state when the write currents are removed. The "wiggled" value is then compared to the "before" value to determine the state of the cell. The sense amplifier senses the resistance change without changing the state of the cell.

By eliminating the need for a reference cell, greater accuracy is provided because noise due to mismatch between the reference cells and memory cells is eliminated. Also, the present invention can be useful in a MRAM having a toggling memory cell that uses a reference cell because the states of the reference cells must first be determined before reading from the memory.

Figure 1:
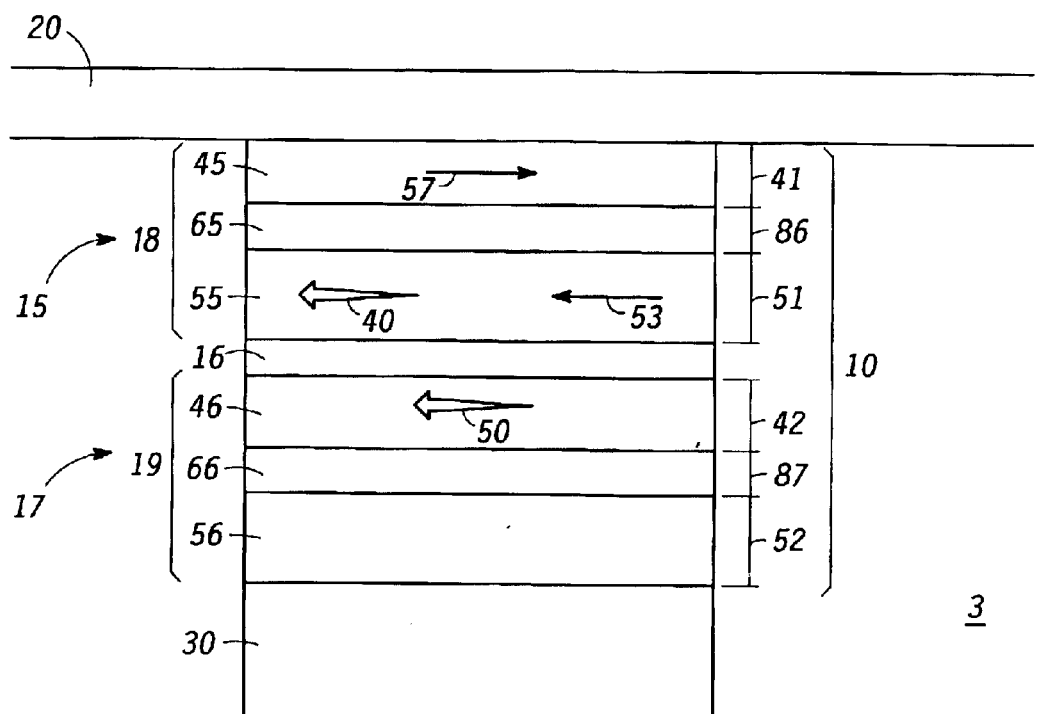
FIG. 1 is a simplified sectional view of a magnetoresistive random access memory device.

Turn now to FIG. 1, which illustrates a simplified sectional view of an MRAM array 3 in accordance with the preferred embodiment of the present invention. In this illustration, only a single magnetoresistive memory device is shown, but it will be understood that MRAM array 3 consists of a number of MRAM devices 10 and we are showing only one such device for simplicity in describing the writing method.

MRAM device 10 includes a write word line 20 and a write bit line 30. Write word line 20 and write bit line 30 include conductive material such that a current can be passed therethrough. In this illustration, write word line 20 is positioned on top of MRAM device 10 and write bit line 30 is positioned on the bottom of MRAM device 10 and is directed at a 90° angle to word line (See FIG. 2). As an alternative, write word line 20 may be positioned on the bottom of MRAM device 10 and write bit line 30 may be positioned on top of MRAM device 10.

MRAM device 10 includes tunnel junction comprising a first magnetic region 15, a tunneling barrier 16, and a second magnetic region 17, wherein tunneling barrier 16 is sandwiched therebetween first magnetic region 15 and second magnetic region 17. In the preferred embodiment, magnetic region 15 includes a tri-layer structure 18, which has an anti-ferromagnetic coupling spacer layer 65 between two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic (SAF) layer material structures other than tri-layer structures and the use of tri-layer structures in this embodiment is for illustrative purposes only.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably 45°, from write word line 20 and write bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of 1 to 5 for a non-circular plan. For example, in one embodiment, the non-circular plan may be a structure with an aspect ratio of approximately 2. However, we illustrate a plan that is circular (See FIG. 2). MRAM device 10 is circular in shape to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between write word line 20 and write bit line 30, as will be discussed presently.

Figure 2:
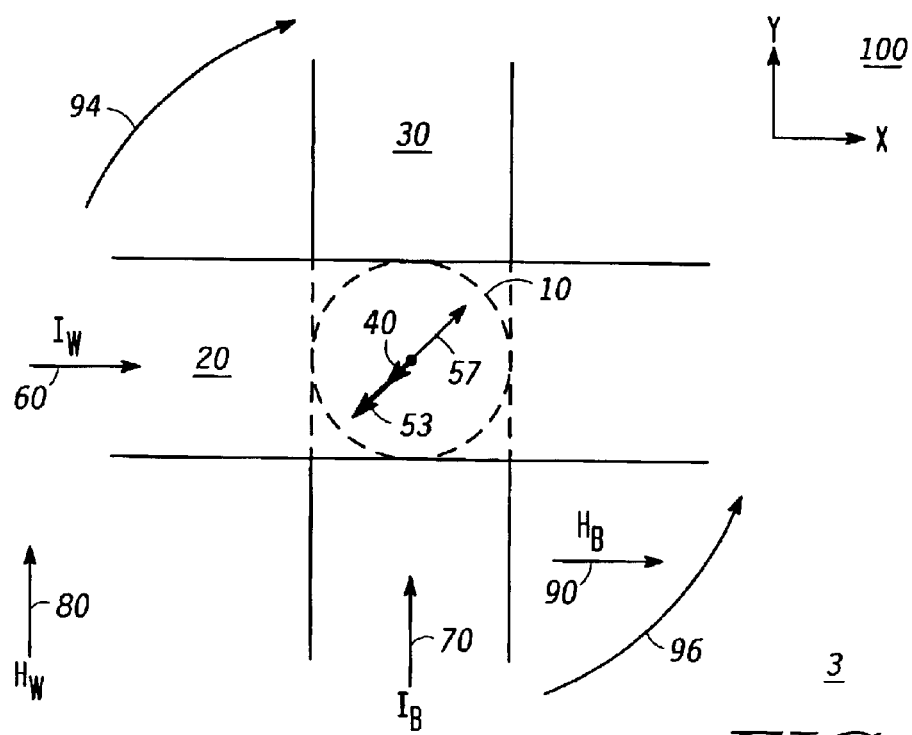
FIG. 2 is a simplified plan view of a magnetoresistive random access memory device with word and bit lines.

Turn now to FIG. 2, which illustrates a simplified plan view of a MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In the preferred embodiment, a write word current 60 is defined as being positive if flowing in a positive x-direction and a write bit current 70 is defined as being positive if flowing in a positive y-direction. The purpose of write word line 20 and write bit line 30 is to create a magnetic field within MRAM device 10. A positive write word current 60 will induce a circumferential write word magnetic field, $H_W$ 80, and a positive write bit current 70 will induce a circumferential write bit magnetic field, $H_B$ 90. Since, in this example, write word line 20 is above MRAM device 10, in the plane of the element, $H_W$ 80 will be applied to MRAM device 10 in the positive y-direction for a positive write word current 60. Similarly, since write bit line 30 is below MRAM device 10, in the plane of the element, $H_B$ 90 will be applied to MRAM device 10 in the positive x-direction for a positive write bit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
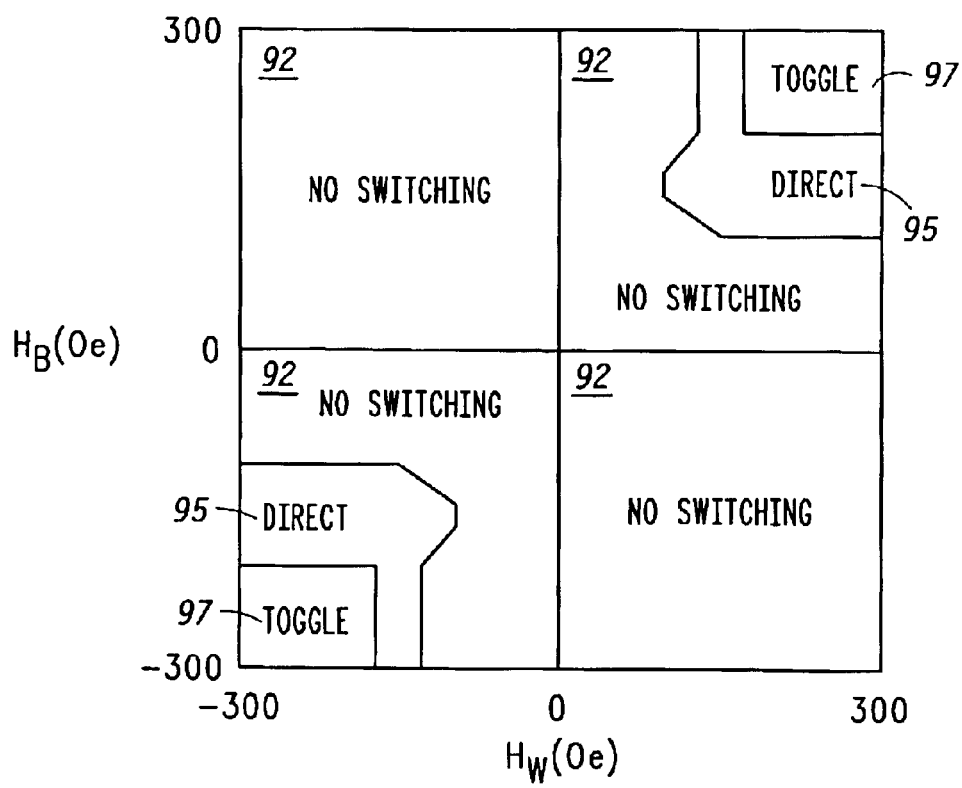
FIG. 3 is a graph illustrating a simulation of the magnetic field amplitude combinations that produce the direct of toggle write mode in the magnetoresistive random access memory device.
Figure 4:
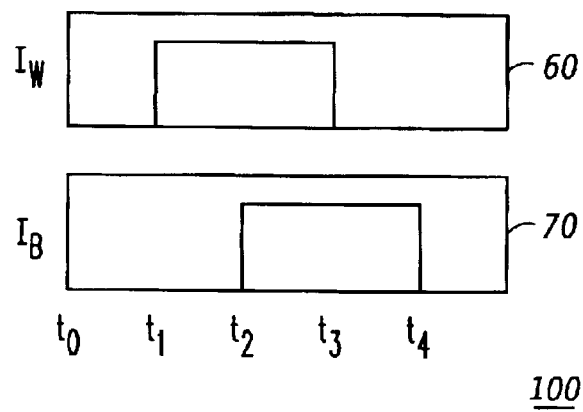

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the write word line magnetic field amplitude in Oersteds, and the y-axis is the write bit line magnetic field amplitude in Oersteds. The magnetic fields are applied in a pulse sequence 100 as shown in FIG. 4 wherein pulse sequence 100 includes write word current 60 and write bit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both write word line 20 and write bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the write word and write bit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both write word line 20 and write bit line 30. For example, if a '1' is initially stored then the state of the device will be switched to a '0' after one positive current pulse sequence is flowed through the write word and write bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in write word line 20 and write bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Turn now to FIG. 5 which illustrates the toggle write mode for writing a '1' to a '0' using pulse sequence 100. In this illustration at time $t_0$, magnetic moment vectors 53 and 57 are oriented in the preferred directions as shown in FIG. 2. This orientation will be defined as a '1'.

At a time $t_1$, a positive write word current 60 is turned on, which induces $H_W$ 80 to be directed in the positive y-direction. The effect of positive $H_W$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_W$ 80. Hence, magnetic moment vector 53 is rotated in clockwise direction 94. Since resultant magnetic moment vector 40 is the vector addition of magnetic moment vectors 53 and 57, magnetic moment vector 57 is also rotated in, clockwise direction 94.

At a time t$_2$, positive write bit current 70 is turned on, which induces positive H$_B$ 90. Consequently, resultant magnetic moment vector 40 is being simultaneously directed in the positive y-direction by H$_W$ 80 and the positive x-direction by H$_B$ 90, which has the effect of causing effective magnetic moment vector 40 to further rotate in clockwise direction 94 until it is generally oriented at a 45° angle between the positive x- and positive y-directions. Consequently, magnetic moment vectors 53 and 57 will also further rotate in clockwise direction 94.

At a time t$_3$, write word current 60 is turned off so that now only H$_B$ 90 is directing resultant magnetic moment vector 40, which will now be oriented in the positive x-direction. Both magnetic moment vectors 53 and 57 will now generally be directed at angles passed their anisotropy hard-axis instability points.

At a time t$_4$, write bit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y- and positive x-directions. This preferred direction is also 180° from the initial direction of magnetic moment vector 53 at time t$_0$ and is is defined as '0'. Hence, MRAM device 10 has been switched to a '0'. It will be understood that MRAM device 10 could also be switched by rotating magnetic moment vectors 53, 57, and 40 in counter clockwise direction 96 by using negative currents in both write word line 20 and write bit line 30, but is shown otherwise for illustrative purposes.

Turn now to FIG. 6 which illustrates the toggle write mode for writing a '0' to a '1' using pulse sequence 100. Illustrated are the magnetic moment vectors 53 and 57, as well as resultant magnetic moment vector 40, at each of the times t$_0$, t$_1$, t$_2$, t$_3$, and t$_4$ as described previously showing the ability to switch the state of MRAM device 10 from '0' to '1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 7:
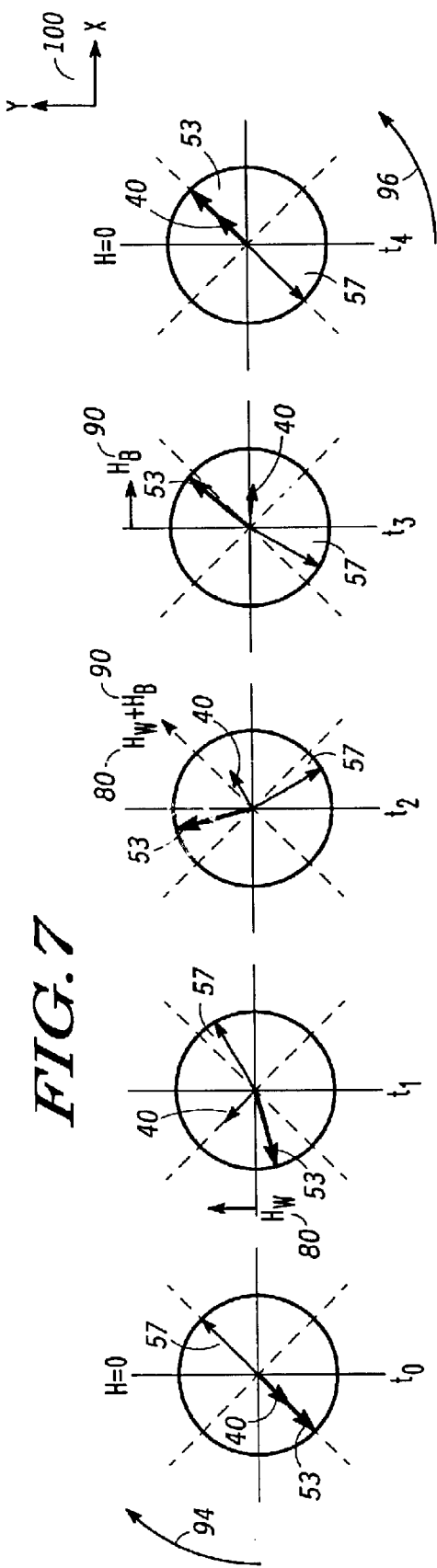
FIG. 7 is a graph illustrating the rotation of the magnetic moment vectors for a magnetoresistive random access memory device for the direct write mode when writing a '1' to a '0'.

Turn now to FIG. 7 which illustrates an example of writing a '1' to a '0' using the direct write mode using pulse sequence 100. Here again, the memory state is initially a '1' with magnetic moment vector 53 directed 45° with respect to the negative x- and negative y-directions and magnetic moment vector 57 directed 45° with respect to the positive x- and positive y-directions. Following the pulse sequence as described above with positive write word current 60 and positive write bit current 70, the writing occurs in a similar manner as the toggle write mode as described previously. Note that the moments again 'FLOP' at a time t$_1$, but the resulting angle is canted from 90° due to the unbalanced moment and anisotropy. After time t$_4$, MRAM device 10 has been switched to the '0' state with resultant magnetic moment 40 oriented at a 45° angle in the positive x- and positive y-directions as desired. Similar results are obtained when writing a '0' to a '1' only now with negative write word current 60 and negative write bit current 70.

Figure 8:
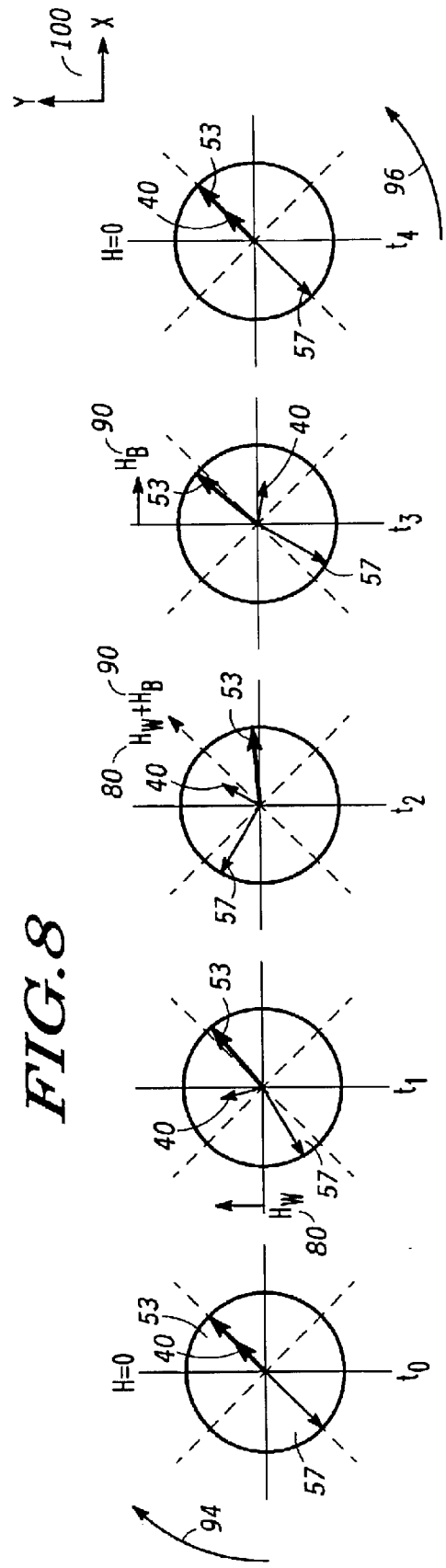
FIG. 8 is a graph illustrating the rotation of the magnetic moment vectors for a magnetoresistive random access memory device for the direct write mode when writing a '0' to a state that is already a '0'.

Turn now to FIG. 8 which illustrates an example of writing using the direct write mode when the new state is the same as the state already stored. In this example, a '0' is already stored in MRAM device 10 and current pulse sequence 100 is now repeated to store a '0'. Magnetic moment vectors 53 and 57 attempt to "FLOP" at a time t$_1$, but because the unbalanced magnetic moment must work against the applied magnetic field, the rotation is diminished. Hence, there is an additional energy barrier to rotate out of the reverse state. At time t$_2$, the dominant moment 53 is nearly aligned with the positive x-axis and less than 45° from its initial anisotropy direction. At a time t$_3$, the magnetic field is directed along the positive x-axis. Rather than rotating further clockwise, the system now lowers its energy by changing the SAF moment symmetry with respect to the applied field. The passive moment 57 crosses the x-axis and the system stabilizes with the dominant moment 53 returned to near its original direction. Therefore, at a time t$_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both write word line 60 and write bit line 70 and, conversely, to write a '1' negative current is required in both write word line 60 and write bit line 70.

If larger fields are applied, eventually the energy decrease associated with a flop and scissor exceeds the additional energy barrier created by the dipole energy of the unbalanced moment that is preventing a toggle event. For our purposes, scissor is the reduction in the relative angle between the magnetic moment direction of the ferromagnetic layers in the free layer. At this point, a toggle event will occur and the switching is described by region 97.

Region 95 in which the direct write mode applies can be expanded, i.e. toggle mode region 97 can be moved to higher magnetic fields, if the times t$_3$ and t$_4$ are equal or made as close to equal as possible. In this case, the magnetic field direction starts at 45° relative to the bit anisotropy axis when write word current 60 turns on and then moves to parallel with the bit anisotropy axis when write bit current 70 turns on. This example is similar to the typical magnetic field application sequence. However, now write word current 60 and write bit current 70 turn off substantially simultaneously, so that the magnetic field direction does not rotate any further. Therefore, the applied field must be large enough so that the resultant magnetic moment vector 40 has already moved past its hard-axis instability point with both write word current 60 and write bit current 70 turned on. A toggle writing mode event is now less likely to occur, since the magnetic field direction is now rotated only 45°, instead of 90° as before. An advantage of having substantially coincident fall times, t$_3$ and t$_4$, is that now there are no additional restrictions on the order of the field rise times t$_1$ and t$_2$. Thus, the magnetic fields can be turned on in any order or can also be substantially coincident.

The writing methods described previously are highly selective because only the MRAM device that has both write word current 60 and write bit current 70 turned on between time t$_2$ and time t$_3$ will switch states. This feature is illustrated in FIGS. 9 and 10. FIG. 9 illustrates pulse sequence 100 when write word current 60 is not turned on and write bit current 70 is turned on. FIG. 10 illustrates the corresponding behavior of the state of MRAM device 10. At a time t$_0$, magnetic moment vectors 53 and 57, as well as resultant magnetic moment vector 40, are oriented as described in FIG. 2. In pulse sequence 100, write bit current 70 is turned on at a time $t_1$. During this time, $H_B$ 90 will cause resultant magnetic moment vector 40 to be directed in the positive x-direction.

Since write word current 60 is never switched on, resultant magnetic moment vectors 53 and 57 are never rotated through their anisotropy hard-axis instability points. As a result, magnetic moment vectors 53 and 57 will reorient themselves in the nearest preferred direction when write bit current 70 is turned off at a time $t_3$, which in this case is the initial direction at time $t_0$. Hence, the state of MRAM device 10 is not switched. It will be understood that the same result will occur if write word current 60 is turned on at similar times described above and write bit current 70 is not turned on. This feature ensures that only one MRAM device in an array will be switched, while the other devices will remain in their initial states. As a result, unintentional switching is avoided and the bit error rate is minimized.

Figure 11:
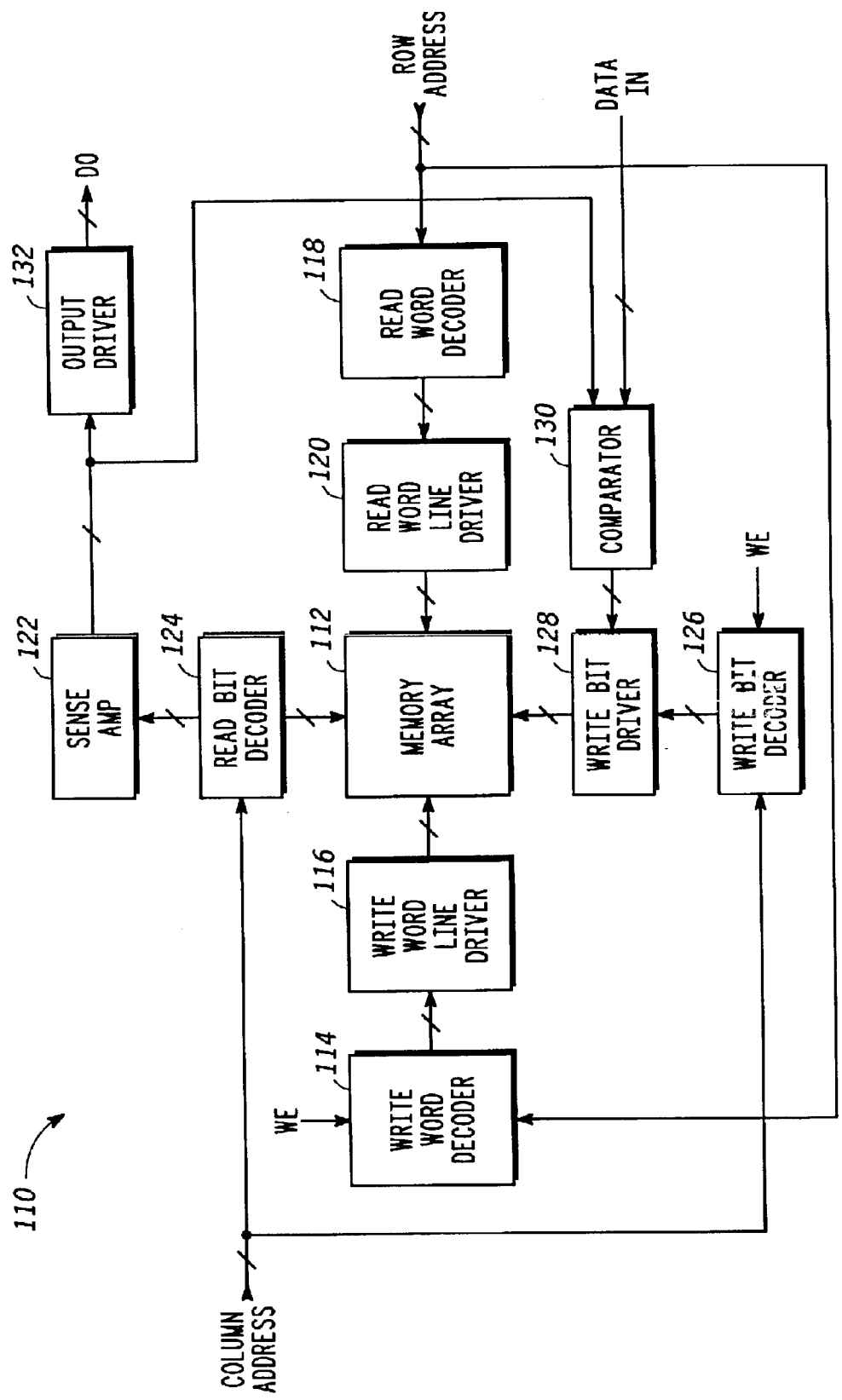
FIG. 11 is a block diagram of a toggle memory.

Shown in FIG. 11 is a memory 110 comprising a memory array 112, a write word decoder 114, a write word line driver 116, a read word decoder 118, a read word line driver 120, one or more sense amplifiers 122, a read bit decoder 124, a write bit decoder 126, a write bit driver 128, a comparator 130, and an output driver 132. These elements are coupled together by multiple lines. For example read bit decoder 124 receives a column address made up of multiple address signals. Memory array 112 is an array of memory cells that can be switched with a toggle operation. A section of memory cells for the memory array 112 is memory array 200 shown in FIG. 14, which is an MRAM cell array that is written in the method described for memory array 3 of FIG. 1 in that writing occurs in four steps of 45° angles until 180° is reached. In this particular preferred cell array, there are separate word lines and bit lines for a write operation and a read operation.

Read word decoder 118 receives a row address and is coupled to read word line driver 120, which in turn is coupled to memory array 112. For a read, read word decoder 118 selects a read word line in memory array 112 based on the row address. The selected word line is driven by read line driver 120. Read bit decoder 124, which receives the column address and is coupled between sense amplifier 122 and memory array 112, selects a read bit line from read bit decoder 124, based on the column address, from memory array 112 and couples it to sense amplifier 122. Sense amplifier 122 detects the logic state and couples it to output driver 132 and comparator 130. Output driver 132, for a read, provides a data output signal DO. For a write operation, comparator 130 compares the logic state of the selected cell, which is provided by sense amplifier 122, to the desired logic state to be written as provided by the data in.

Write word decoder 114 receives the row address and is coupled to write word line driver 116, which in turn is coupled to memory array 112. For a write, write word decoder 114 selects a write word line, based on the row address, in memory array 112, and write word line driver in turn drives that selected write word line. Write bit decoder 126 receives the column address and is coupled to the write bit driver 128, which is coupled to the memory array 112. Writer bit decoder 126 selects a write bit line, based on the column address, and write bit driver 128 in turn drives the selected write bit line in order to toggle the state of the selected cell.

Since memory array 112 is a toggle memory, a write toggling operation is completed only if the logic state of the cell needs to be flipped in order to achieve the desired resulting logic state for the selected cell. Thus, comparator 130 receives the output of a read operation on the selected cell from sense amplifier 122 and determines if the selected cell already has the desired logic state. If the selected cell, as determined by the row and column address, does have the desired logic state, then the write operation is terminated. If the logic state of the selected cell is different from the desired state then the comparator indicates to write bit driver 128 that the write is to continue and the write bit driver for the selected write bit line drives the selected write bit line.

Figure 12:
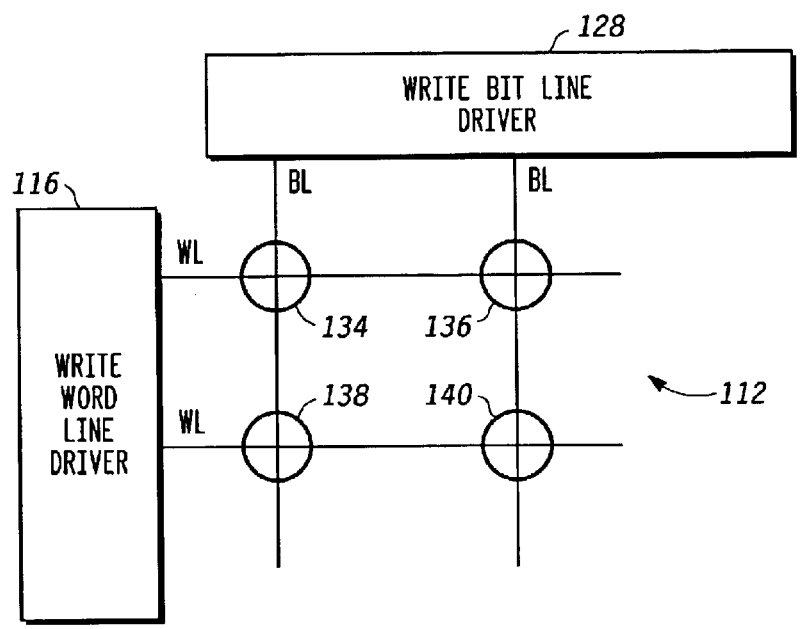
FIG. 12 is a more detailed diagram of a portion of the memory of FIG. 11.

Shown in FIG. 12 is a portion of memory 110 of FIG. 11 comprising the write word line driver 116 coupled to write word lines WL, write bit driver 128 coupled to write bit lines BL, and cells 134, 136, 138, and 140 coupled at intersection of write bit lines BL and write word lines WL. For a write to occur, current is provided to a selected word line WL, while no current is flowing in the selected write bit line, for sufficient time to cause the first angle change in the memory cells along the selected write word line. While current is still flowing in the selected write word line, current is flowed through the selected write bit line to cause the second angle change to the selected memory cell. Only at the intersection of the current carrying write bit line and write word line does this second angle change occur. While current is still flowing through the write bit line, current flow is terminated through the selected write word line to cause a third angle change in the selected memory cell. Only at the intersection of the selected write bit line and the selected write word line does this third change occur. A fourth angle change of the selected memory cell occurs when the current through the selected write bit line is terminated.

Figure 13:
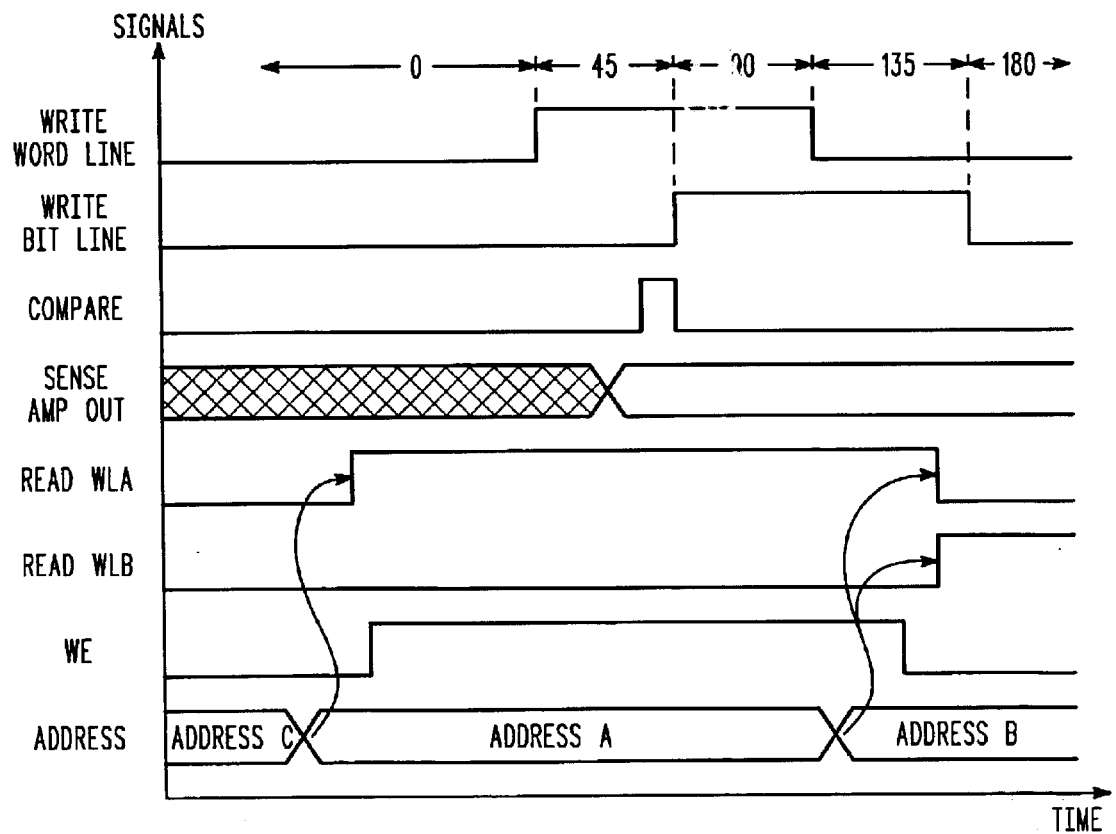
FIG. 13 is a timing diagram useful in understanding the operation of the memory of FIG. 11.

The write operation of memory 110 is further explained by reference to the timing diagram of FIG. 13. Both a read operation and a write toggle operation are initiated by a change in the row or column address as shown by enabling a read word line WLA as shown in FIG. 13. Although the write cannot be executed until it has been determined that the logic state needs to flipped, nonetheless, the write cycle can begin as noted by the write word line being enabled prior to the sense amplifier providing its output and the comparator determining if the logic state needs to be flipped. Enabling (causing current to flow through) the write word line does cause the first angle change in the selected cell as well as all of the cells along the selected write word line, but this change is reversed if the current is terminated without enabling the write bit line.

Thus, the selected write word line can be enabled prior to the comparator making its determination because the first angle change is reversed simply by removing the current. This must be the case because all of the cells on a selected write word line experience the first angle change and all but one are not selected. Only the selected cell, however, experiences the second angle change and that occurs when the write bit line is enabled. This is shown as occurring after the comparator has made its determination that a logic state change is desired. The first angle change is shown as being from 0° to 45° and the second change is from 45° to 90°. The third angle change is shown as occurring when the write word line is disabled (current is terminated). This is shown as being from 90° to 135°. The final angle change shown is the fourth angle change and occurs when the write bit line is disabled. This angle change is shown as being from 135° to 180°.

This also shows that the final stages of the write can continue after the next address change, which initiates another cycle. The beginning of a cycle always begins with a read even if the cycle is a write cycle. Address A is changed to address B and causes read word line B to be selected. This does not interfere with the writing of the previously selected cell. This depicts a read word line change, but even if the address is a column only change so that the selected read word line does not change, the continued flow of current does not adversely affect the completion of the write. Also note that it is not necessary that the write enable be active at the time the cycle begins, because all cycles begin with a read operation anyway. The write enable signal must be active sufficiently early though for the write bit line to become active.

The explanation has been with respect to a single cell being selected, but this was for ease of understanding. In practice, typically a number of cells will be selected and that is indicated in FIG. 11 by the signal connections between the elements being multiple signal lines. Thus, for example, if memory 110 were a ×16 memory, comparator 130 would actually make 16 different comparisons, one for each selected cell. Of the sixteen comparisons, only those that indicated a non-match would cause a write operation of those selected cells with the non-match. The selected cells that resulted in a match would not be flipped.

Figure 14:
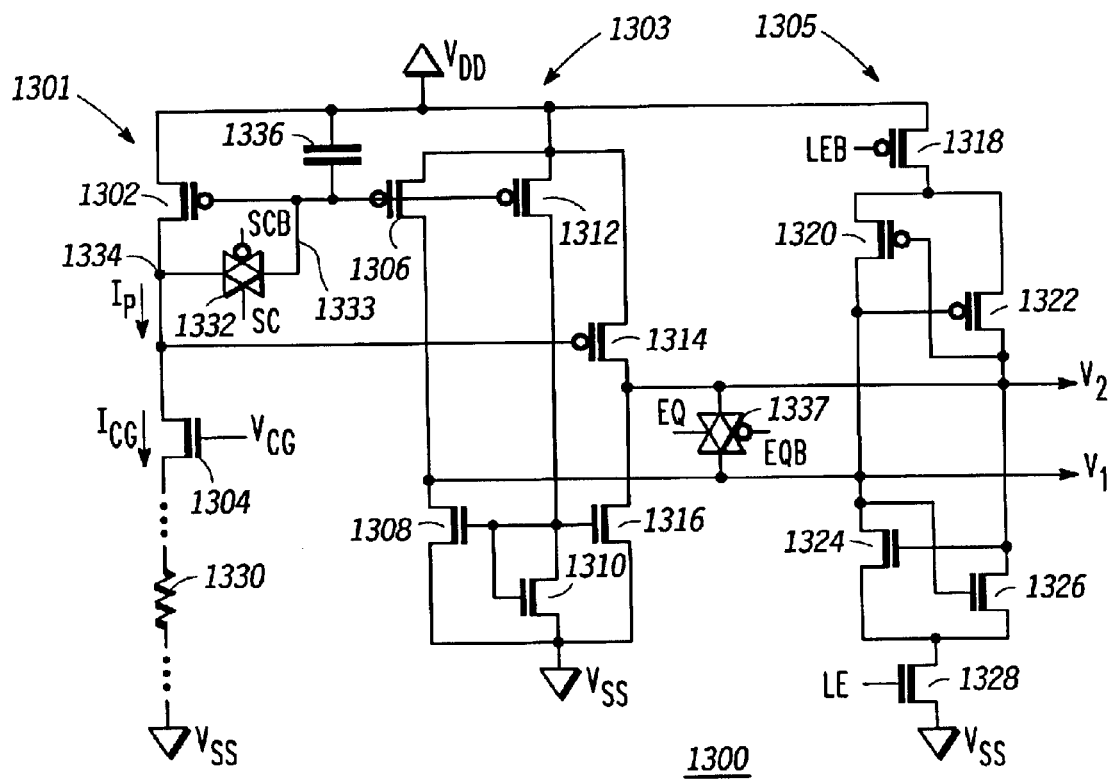
FIG. 14 is a schematic diagram of a sense amplifier of the toggle memory of FIG. 11 in accordance with one embodiment of the present invention.

FIG. 14 is a schematic diagram of a sense amplifier 1300 of the toggle memory of FIG. 11. Sense amplifier 1300 is one embodiment of sense amplifier 122 of FIG. 11. Sense amplifier 1300 includes pre-amplifier stage 1301, gain stage 1303, and cross-coupled latch 1305. Pre-amplifier stage 1301 includes P-channel transistor 1302, N-channel transistor 1304, transmission gate 1332, and capacitor 1336. Gain stage 1303 includes P-channel transistors 1306, 1312, and 1314, N-channel transistors 1308, 1310, and 1316, and transmission gates 1337. Cross-coupled latch 1305 includes P-channel transistors 1318, 1320, and 1322, and N-channel transistors 1324, 1326, and 1328. Pre-amplifier stage 1301 is a current to voltage converter. Note that in the discussion below, signal SCB is a logical complement of signal SC, signal EQB is a logical complement of signal EQ, signal LEB is a logical complement of signal LE, and output signals V1 and V2 are logical complements of each other.

Figure 15:
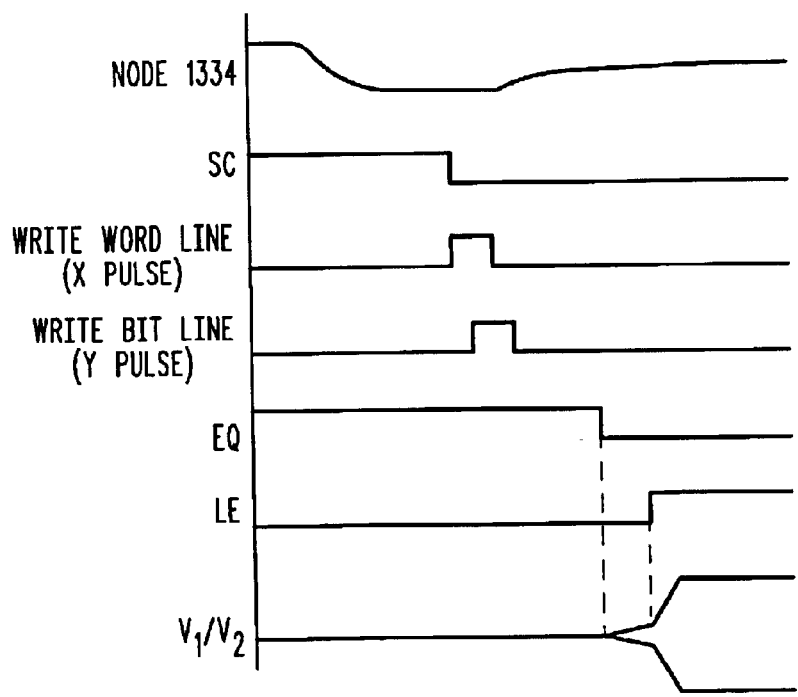
FIG. 15 is a timing diagram useful in understanding a first read operation using the sense amplifier of FIG. 14.
Figure 16:
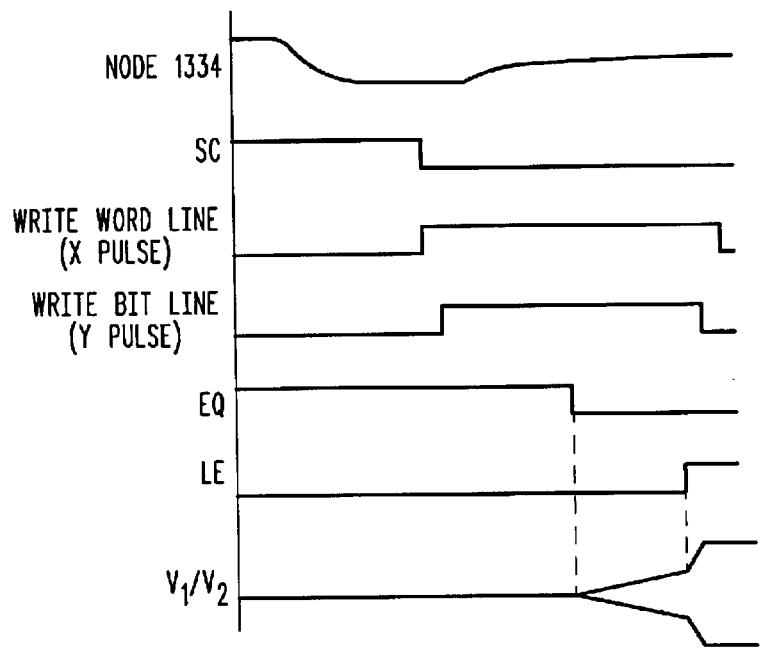
FIG. 16 is a timing diagram useful in understanding a second read operation using the sense amplifier of FIG. 14.

FIG. 15 and FIG. 16 illustrate two different methods for reading the memory cell. FIG. 15 is a timing diagram useful in understanding a read operation using sense amplifier 1300 by "toggling" the memory cell being read. FIG. 16 is a timing diagram useful in understanding a read operation using sense amplifier 1300 by "wiggling" the memory cell being read. The operation of sense amplifier 1300 will be described in connection with the description of FIGS. 14–16.

To read a memory cell of memory array 112 using the toggling method, first the memory state, or resistance, of the memory cell is measured. The memory cell is then toggled to the other, opposite, memory state. The resistance of the memory cell is measured again. Then the resistance of the cell before toggling is compared to the resistance of the cell after toggling. If the "before" resistance is greater than the "after" resistance, then the original state of the cell was a high state. Conversely, if the "before" resistance of the cell is less than the "after" resistance, then the original state of the cell was a low state.

The sense amplifier reads the memory cell during a "toggling" read cycle (FIG. 15) of memory 110 (FIG. 11) as follows. A memory cell resistance, represented by resistor 1330 in FIG. 14, is coupled to the source of N-channel transistor 1304 via transistors (not shown) gated by decoded signals (not shown in FIG. 14) to read the value of the cell. N-channel transistor 1304 receives a gate bias voltage $V_{cg}$ resulting in a drain/source current $I_{cg}$ through transistor 1304. P-channel transistor 1302 is diode-connected via transmission gate 1332, is enabled during the initial read cycle (SC high in FIG. 15.), and sources current $I_p$. The pre-amplifier develops a steady state bias at node 1334 when current $I_{cg}$ equals current $I_p$. With the transmission gate 1332 enabled, the voltage on node 1333 equals the voltage on node 1334, thus storing the "before" state on capacitor 1336. After storing the "before" state, the SC signal swings low disabling the transmission gate 1332. The value, or state, of the cell is then toggled by asserting signals WRITE WORD LINE (X PULSE) and WRITE BIT LINE (Y PULSE) as illustrated in FIG. 15. This causes the stored value of the accessed cell to be toggled from one unknown state to the other unknown state. When the cell is toggled, the resistance value of resistor 1330 will either increase or decrease depending on the state before the cell was toggled. The preamplifier responds to the change in resistance by developing a different voltage on node 1334: an increase/decrease in the resistance will correspondingly increase/decrease this voltage. Referring to FIG. 14, the voltage on node 1334 and the stored voltage on node 1333 are applied to the inputs of the gain stage 1303 corresponding to the gate of P-channel transistor 1314 and the gates of transistors 1306 and 1312, respectively. After toggling the cell, the equalization signals EQ/EQB are de-asserted causing transmission gate 1337 to become non-conductive and enabling gain stage 1301. The gain stage compares the "before" state bias on node 1333 to the "after" state bias on node 1334 and amplifies the voltages providing outputs V1/V2 as illustrated in FIG. 15. After the differential voltage signals V1/V2 develop, signals LE/LEB are asserted to enable cross-coupled latch 1305 and store the output signals V1/V2. Gain stage 1303 allows sense amplifier 1300 to sense relatively small voltage changes. In applications of sense amplifier 1300 where the voltage changes between states are relatively large, the use of gain stage 1303 may not be needed. Note that all of the timing signals are provided by a timing block (not shown) that receives an external clock signal (not shown).

As discussed above, the original state of a selected cell may also be determined by "wiggling" the cell instead of "toggling" the cell. FIG. 16 illustrates one embodiment of reading by wiggling the cell using sense amplifier 1300. The order in which the sensing signals are asserted in FIG. 16 is similar to FIG. 15, except that the WRITE WORD LINE and WRITE BIT LINE signals are de-asserted differently to wiggle the selected cell instead of toggling it. First, the value of the cell is read, or measured, before rotating the magnetic field. The "before" value is stored on capacitor 1336. The cell is then rotated toward the opposite state, or "wiggled". As illustrated in FIG. 16, the WRITE WORD LINE and then the WRITE BIT LINE signals are asserted to rotate the magnetic field polarization for about 90 degrees or less to change the resistance of the cell. The WRITE WORD LINE and WRITE BIT LINE are then held for a predetermined amount of time to insure that output signals V1/V2 separate sufficiently for the wiggled value to be latched by cross-coupled latch 1305. After the predetermined amount of time, the WRITE BIT LINE signal is de-asserted before the WRITE WORD LINE signal is de-asserted to allow the magnetic field polarization to return to the original orientation.

In the "wiggling" method, the circuit effectively performs a comparison to provide differential output signals V1/V2 without changing the cell state. If the "wiggled" value is greater than the "before" value, then the current state of the cell is a low. If the "wiggled" value is less than the "before" value, then the present value of the cell is a high.

Generally, the sense amplifier uses a current to voltage converter, a sample and hold circuit, and a latch. The circuit may also include a gain/comparator stage as illustrated in FIG. 14. However, the type of circuit used to perform the sense amplifier functions as discussed herein are not limited to the circuits disclosed in FIG. 14 and FIG. 17. For example, gain stage 1303 may be implemented as a differential amplifier or other type of amplifier appropriate for providing the necessary gain.

Figure 17:
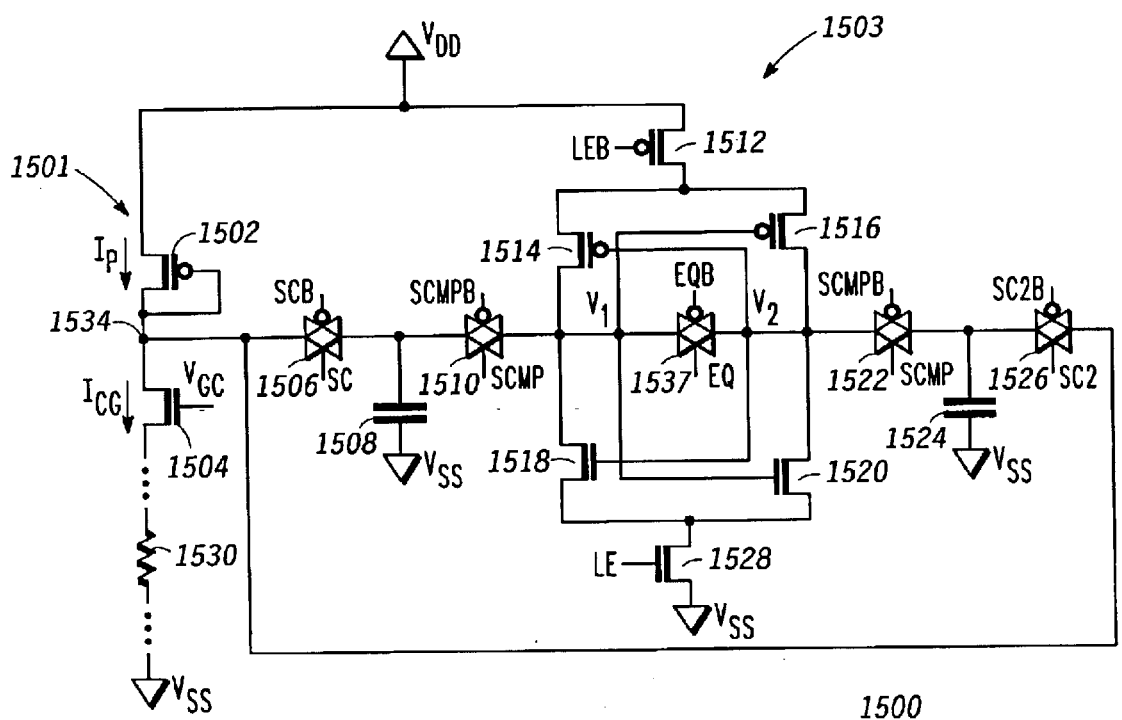
FIG. 17 is a schematic diagram of a sense amplifier of the toggle memory of FIG. 11 in accordance with another embodiment of the present invention.

FIG. 17 is a schematic diagram of a sense amplifier 1500 of the toggle memory of FIG. 11 in accordance with another embodiment of the present invention. Sense amplifier 1500 is one embodiment of sense amplifier 122 of FIG. 11, and includes pre-amplifier stage 1501, cross-coupled latch 1503, capacitors 1508 and 1524, and transmission gates 1506, 1510, 1522, and 1526. Note that in the discussion below, signal SCB is a logical complement of signal SC, signal SC2B is a logical complement of signal SC2, signal SCMPB is a logical complement of signal SCMP, signal EQB is a logical complement of signal EQ, signal LEB is a logical complement of signal LE, and output signals V1 and V2 are logical complements of each other.

Like sense amplifier 1300 of FIG. 14, sense amplifier 1500 is a self-reference amplifier, that is, it is intended to be used when reading from the memory array without the benefit of a reference cell. However, sense amplifier 1500 is different than sense amplifier 1300 in that separate capacitors are used to store the before and after states. The "after" states can be determined by toggling the cell or wiggling the cell as discussed above for the operation of sense amplifier 1300 of FIG. 14.

Figure 18:
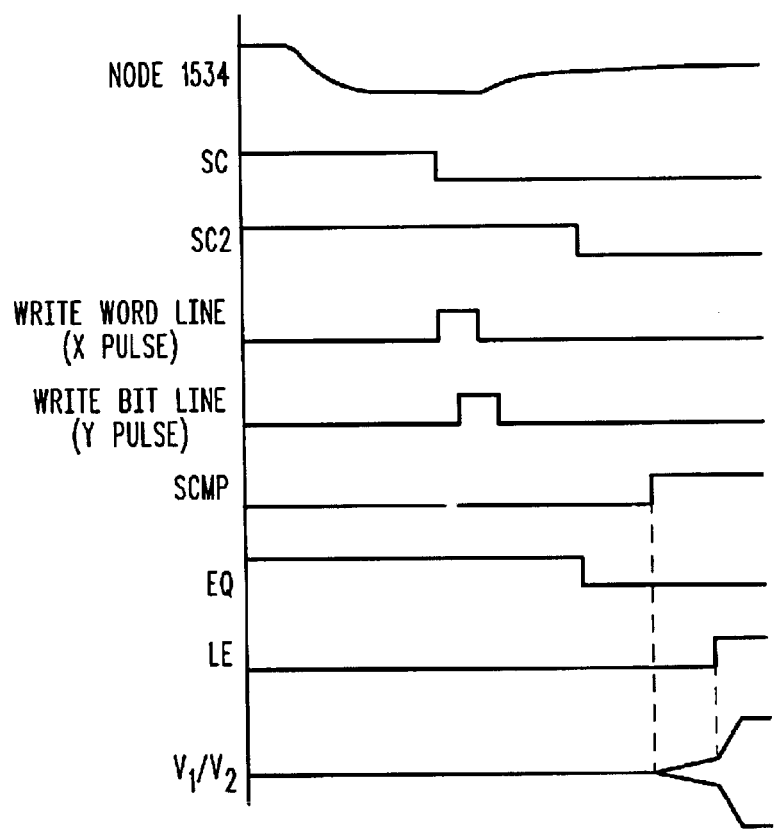
FIG. 18 is a timing diagram useful in understanding a first read operation using the sense amplifier of FIG. 17.
Figure 19:
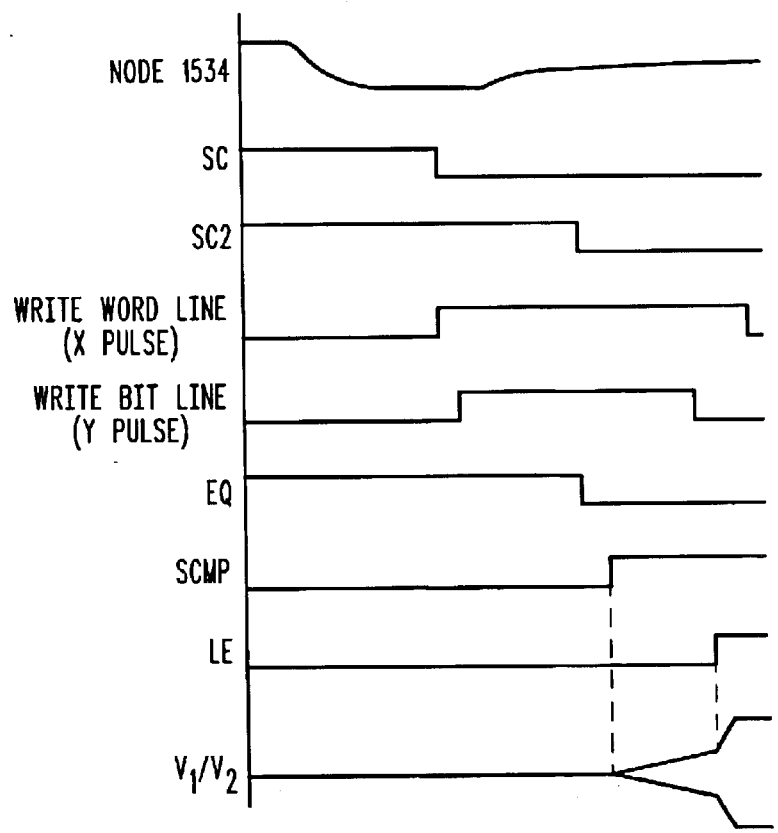
FIG. 19 is a timing diagram useful in understanding a second read operation using the sense amplifier of FIG. 17.

FIG. 18 and FIG. 19 illustrate two different methods for reading the memory cell. FIG. 18 is a timing diagram useful in understanding a read operation using sense amplifier 1500 by "toggling" the memory cell being read. FIG. 19 is a timing diagram useful in understanding a read operation using sense amplifier 1500 by "wiggling" the memory cell being read. The operation of sense amplifier 1500 will be described in connection with the description of FIGS. 17–19.

To read a memory cell of memory array 112 using the toggling method, a first voltage, determined by the resistance of the memory cell, is stored in capacitor 1508. The memory cell is then toggled to the other, opposite, memory state. A second voltage, determined by the different resistance of the memory cell, is stored in capacitor 1524. Then the resistance of the cell before toggling is effectively compared to the resistance of the cell after toggling by observing which way cross-coupled latch 1503 settles. If the "before" resistance is greater than the "after" resistance, then the original state of the cell was a high state. Conversely, if the "before" resistance of the cell is less than the "after" resistance, then the original state of the cell was a low state.

A toggling read operation will be described with reference to both FIG. 17 and FIG. 18. During a "toggling" read cycle of memory 110 (FIG. 11), a memory cell resistance, represented by resistor 1530 in FIG. 17, is coupled to the source of N-channel transistor 1504 via decoding transistors (not shown) gated by decoded signals (not shown in FIG. 17) to read the value of the selected cell. N-channel transistor 1504 receives a gate bias voltage $V_{cg}$ resulting in a drain/source current $I_{cg}$ through transistor 1504. P-channel transistor 1502 is diode-connected to provide a current $I_p$. With transmission gate 1506 conductive, the read voltage through transmission gate 1506 is stored on capacitor 1508. After a predetermined amount of time to allow the voltage at node 1534 to stabilize, signals SC/SCB are de-asserted, causing transmission gate 1506 to be non-conductive. The value, or state, of the cell is then toggled by asserting signals WRITE WORD LINE (X PULSE) and WRITE BIT LINE (Y PULSE) as illustrated in FIG. 18. This causes the stored value of the accessed cell to be toggled from one unknown state to the other unknown state. When the cell is toggled, the resistance value of resistor 1530 will either increase or decrease depending on the state before the cell was toggled. The preamplifier 1501 responds to the change in resistance by developing a different voltage on node 1534: increasing/decreasing the resistance will correspondingly increase/decrease this voltage. The new voltage on node 1534 is then stored on capacitor 1524 via transmission gate 1526 after which signal SC2/SC2B is de-asserted. After the "before" and "after" voltages are stored on capacitors 1508 and 1524, equalization signals EQ/EQB are de-asserted, thus causing transmission gate 1527 to become non-conductive. Signals SCMP/SCMPB are asserted to make transmission gates 1510 and 1522 conductive and provide the voltages stored by capacitors 1508 and 1524 to cross-coupled latch 1503. Signals LE/LEB are asserted to enable cross-coupled latch 1503 to store a state corresponding to the original state of the selected cell. For example, if the "before" voltage stored on capacitor 1508 is larger than the "after" voltage stored on capacitor 1524, then cross-coupled latch output signals V1/V2 will indicate that the original state of the selected cell is larger than the toggled state.

As discussed above regarding the operation of sense amplifier 1300, the original state of a selected cell may also be determined using sense amplifier 1500 by "wiggling" the cell instead of "toggling" the cell. FIG. 19 illustrates one embodiment of reading by wiggling the magnetic polarization of the cell using sense amplifier 1500. The order in which the sensing signals are asserted in FIG. 19 is similar to FIG. 18, except that the WRITE WORD LINE and WRITE BIT LINE signals are asserted differently to wiggle the selected cell instead of toggling it. First, the value of the cell is read, or measured, before rotating the magnetic field. The "before" value is stored on capacitor 1508. The cell is then rotated toward the opposite state and the "wiggled" value of the cell is stored on capacitor 1524. As illustrated in FIG. 19, the WRITE WORD LINE signal is asserted, then the WRITE BIT LINE is asserted to cause rotation of the magnetic polarization to about 90 degrees from the original orientation. The partial rotation will change the resistance of the cell and the difference in resistance can be used to determine the original state as discussed above. The WRITE WORD LINE and WRITE BIT LINE are then held for a predetermined amount of time to insure that output signals V1/V2 separate sufficiently for the wiggled value to be latched by cross-coupled latch 1503. After the predetermined amount of time, the WRITE BIT LINE signal is de-asserted before the WRITE WORD LINE signal is de-asserted to allow the magnetic field polarization to return to the original orientation.

The circuit effectively performs a comparison to provide a result in the form of differential output signals V1/V2. If the "wiggled" value is greater than the "before" value, then the current state of the cell is a low. If the "wiggled" value is less than the "before" value, then the present value of the cell is a high.

Wiggling the cell during a write operation instead of toggling the cell, the read operation may improve performance as a second write is not required to return the bit to its original state. However, because the wiggled resistance change of the cell is less than the toggled resistance change, the signal difference between a sensed high state and a sensed low state is less. Note that the use of the WRITE WORD LINE signal and the WRITE BIT LINE signal to "wiggle" the cell as illustrated in FIGS. 16 and 19 is only one way to wiggle the cell. There are other signal combinations that are possible to wiggle the cell in accordance with the present invention. For example, a partial rotation of the cell, thus partial resistance change, may be obtained by asserting only one of the write lines: the WRITE BIT LINE signal may be asserted while the WRITE WORD LINE signal is held low. Also, the illustrated embodiment assumes the toggling and wiggling current safe uni-directional. In other embodiments, the toggling and wiggling currents may be bi-directional.

Various changes and modifications to the embodiments herein chosen for purposes of illustration will readily occur to those skilled in the art. For example, variations in the types of conductivities of transistors, the types of transistors, etc. may be readily made. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

What is claimed is:

1. A sense amplifier, comprising:
   a current to voltage converter coupled by a bit;
   a sample and hold circuit coupled in the current in voltage converter; and
   a latch having a first input coupled to the sample and hold circuit and a second input coupled to the current in voltage converter.

2. The sense amplifier of claim 1, further comprising a differential amplifier coupled between the sample and hold circuit and the latch and between the current to voltage converter and the latch.

3. The sense amplifier of claim 2, wherein the differential amplifier has a first input coupled to the sample and hold circuit and a second input coupled to the current to voltage converter.

4. The sense amplifier of claim 3, wherein the sample and hold circuit comprises a transmission gate coupled to the current to voltage converter and the first input of the differential amplifier.

5. The sense amplifier of claim 4, wherein the sample and hold circuit further comprises a capacitor coupled to the transmission gate and the first input of the differential amplifier.

6. The sense amplifier of claim 5, wherein the current to voltage converter comprises:
   a first transistor having a first current electrode coupled to the bit, a control electrode coupled to a reference terminal, and a second current electrode; and
   a second transistor having a first current electrode coupled to the second current electrode of the first transistor, a control electrode coupled to the sample and hold circuit, and a second current electrode coupled to a power supply terminal.

7. The sense amplifier of claim 6, wherein the latch is enabled in response to a clock signal, wherein the clock signal is generated after the differential amplifier has provided a differential signal of sufficient difference to ensure the latch accurately captures a logic state of the bit.

8. A method for detecting a state of a bit cell, comprising:
   providing a first signal representative of the state of the cell;
   changing the condition of the cell;
   providing a second signal responsive to the step of changing the condition of the cell; and
   providing an output indicating if the second signal is greater than the first signal or if the first signal is greater than the second signal to determine the state of the bit cell.

9. The method of claim 8, further comprising storing the first signal.

10. The method of claim 9, further comprising storing the second signal and wherein the step of providing an output comprises comparing the first signal and the second signal.

11. The method of claim 8, wherein the step providing an output comprises:
    amplifying the first and second signals to provide amplified first and second signals, and
    comparing the amplified first and second signals.

12. The method of claim 11, further comprising latching the output.

13. A sense amplifier, coupled to a bit cell having one of at least a first state and a second state, for detecting an initial state of the bit cell, comprising:
    means for providing a first signal derived from the cell and representative of the initial state of the cell;
    means for changing the condition of the cell from the initial state in the direction of the other state; and
    means, coupled to the means for providing, for detecting if the bit cell changed in the direction toward the first state or in the direction toward the second state, and providing a signal output indicating if the initial state of the bit cell is in the first state or the second state.

14. The sense amplifier of claim 13, wherein the means for providing comprises a sample and hold circuit.

15. The sense amplifier of claim 13, wherein the means for detecting is further characterized as a differential amplifier.

16. The sense amplifier of claim 13, wherein the means for detecting comprises:
    a differential amplifier having a first input coupled to the means for providing, a second input coupled to the bit cell, and an output; and
    a latch, coupled to the output of the differential amplifier, for providing the signal output.

17. The sense amplifier of claim 16, wherein the means for providing is a sample and hold circuit coupled to the bit cell and the first input of the differential amplifier.

18. The sense amplifier of claim 13, wherein the means for changing is further characterized as changing the state of the cell by changing from the initial state to one of the first and second state.

19. The method of claim 13, wherein the means for changing is further characterized as wiggling the memory cell.

* * * * *

UNITED STATES PATENT AND TRADEMARK OFFICE
CERTIFICATE OF CORRECTION

PATENT NO. : 6,760,266 B2  Page 1 of 1
APPLICATION NO. : 10/185566
DATED : July 6, 2004
INVENTOR(S) : Brad J. Garni It is certified that error appears in the above-identified patent and that said Letters Patent is hereby corrected as shown below:

In Column 15, Line 30, Claim No. 1:

Change "by" to --to--.

In Column 15, Line 31, Claim No. 1:

After "coupled" and "current", change "in" to --to--.

In Column 15, Line 35, Claim No. 1:

Change "in" to --to--.

Signed and Sealed this

Twenty-eighth Day of November, 2006

JON W. DUDAS
*Director of the United States Patent and Trademark Office*